United States Patent [19]

Kuhn et al.

[11] Patent Number: 5,636,636

[45] Date of Patent: Jun. 10, 1997

[54] MAGNETIC RESONANCE METHOD FOR IMAGING A MOVING OBJECT AND DEVICE FOR CARRYING OUT THE METHOD

[75] Inventors: Michael H. Kuhn; Dietrich J. K. Holz, both of Hamburg, Germany

[73] Assignee: U.S. Philips Corporation, New York, N.Y.

[21] Appl. No.: 300,676

[22] Filed: Sep. 2, 1994

[30] Foreign Application Priority Data

Sep. 4, 1993 [DE] Germany .................. 43 29 922.9

[51] Int. Cl.$^6$ ................................................ A61B 5/055
[52] U.S. Cl. .................................. 128/653.2; 324/309
[58] Field of Search ........................ 128/653.1, 653.2, 128/653.5; 324/309

[56] References Cited

U.S. PATENT DOCUMENTS

| | | | |
|---|---|---|---|
| 5,042,485 | 8/1991 | Sano et al. | 128/653 |
| 5,111,144 | 5/1992 | Kuhn | 324/309 |
| 5,154,178 | 10/1992 | Shah | 128/653.2 |
| 5,349,956 | 9/1994 | Bonutti | 128/653.5 |
| 5,423,315 | 6/1995 | Margosian et al. | 128/653.5 |
| 5,542,423 | 8/1996 | Bonutti | 128/653.5 |
| 5,562,094 | 10/1996 | Bonutti | 128/653.5 |

FOREIGN PATENT DOCUMENTS 0430322  6/1991  European Pat. Off. .

Primary Examiner—Marvin M. Lateef
Assistant Examiner—Brian L. Casler
Attorney, Agent, or Firm—Jack D. Slobod

[57] ABSTRACT

An MR imaging method and device in which an object to be examined is displaced at a defined speed relative to an examination zone and a plurality of sequences act on the examination zone in the presence of a steady, uniform magnetic field, each of the sequences including at least one RF pulse and possibly a phase encoding gradient, and a MR signal arising in the examination zone, after transposition to another frequency range by means of an oscillator signal, is used to produce an MR image. The method aims to enhance the quality of the MR image produced by preventing movement artefacts. This is achieved in that from one sequence to another, one or more of the frequency of the RF pulses, the frequency of the oscillator signal, and the phase position of the oscillator signal is adjusted in conformity with the position of the object to be examined relative to the examination zone so that a part of the object which is imaged in the MR image moves relative to the examination zone in synchronism with the object.

2 Claims, 3 Drawing Sheets

MAGNETIC RESONANCE METHOD FOR IMAGING A MOVING OBJECT AND DEVICE FOR CARRYING OUT THE METHOD

BACKGROUND OF THE INVENTION

1. Field of the Invention

The invention relates to a magnetic resonance imaging method in which an object to be examined is moved at a defined speed relative to an examination zone and a plurality of sequences act on the examination zone in the presence of a steady, uniform magnetic field, each of said sequences comprising at least one high-frequency pulse and possibly a phase encoding gradient and supplying a respective magnetic resonance signal which, after transposition to another frequency range by way of an oscillator signal, is used to form a magnetic resonance image.

2. Description of the Related Art

A method of this kind is known from EP-OS 430 322, which corresponds to commonly-owned U.S. Pat. No. 5,111, 144. According to the known method, a number of one-dimensional or line-shaped MR images is generated perpendicularly to the movement direction, which MR images together constitute a two-dimensional MR image. The advantage of this method resides in the fact that a survey image can already be formed during the introduction of the patient into the examination zone. The problem encountered in this known method consists in that measurement must be comparatively fast in comparison with the speed of movement, causing an unattractive signal-to-noise ratio. If the measurement speed is reduced in order to enhance the signal-to-noise ratio (i.e. when the repetition time between two sequences is increased), the spatial resolution deteriorates and movement artefacts are liable to occur.

SUMMARY OF THE INVENTION

It is an object of the present invention to propose a method of the kind set forth which offers a good image quality and which is substantially free from movement artefacts. This object is achieved in accordance with the invention in that from one sequence to another a) the frequency of the RF pulses and/or b) the frequency of the oscillator signal and/or c) the phase position of the oscillator signal is adjusted in conformity with the position of the object to be examined relative to the examination zone in such a manner that the part of the object which is imaged in the MR image moves in synchronism with the object.

Thus, in accordance with the invention the parameters governing the sequence are adjusted so that the part of the object which is imaged in the MR image moves in synchronism with the object. The parameter to be chosen in conformity with the position of the object to be examined is dependent on which of the gradient fields required for an MR imaging method extends in the direction of movement of the object to be examined:

a) When the magnetic gradient field associated with a slice-selective RF pulse comprises a gradient extending in the movement direction of the object to be examined, the frequency of the RF pulse must be adapted. This is because this slice-selective RF pulse excites the nuclear magnetization in a slice extending perpendicularly to the movement direction. When the frequency of the RF pulses is varied in proportion to the position of the object to be examined, so that this frequency corresponds to the Larmor frequency (being proportional to the strength of the field resulting from the superposition of the steady, uniform magnetic field and the magnetic gradient field) in a given point of the object, the slice excited by the slice-selective RF pulse will move in synchronism with the object to be examined.

It is to be noted that for MR images of off-centre areas (i.e. areas situated outside the centre of the examination zone) it is known to vary the sequence of RF pulses so that it corresponds to the Larmor frequency at this area. However, the object is not moved during that operation. Furthermore, from U.S. Pat. No. 5,042,485 it is known to determine, with a resting patient, first the correlation between the root of the aorta and the ECG signal and to vary, during a subsequent MR examination, the frequency of the RF pulses in dependence on the ECG signal so as to obtain a focused image of the root of the aorta. It is assumed that the root of the aorta moves periodically with the ECG signal in a reproducible manner. If at all possible, this method enables correction exclusively of movements in one direction and the area in the MR image which is not moved in synchronism with the root cannot be reproduced without artefacts.

b) When the gradient applied during acquisition of the MR signal, being the so-called read gradient, extends in the direction of movement of the object to be examined, the frequency of the oscillator signal whereby the RF signal is transposed to a lower frequency range must be varied linearly as a function of the position of the object to be examined, so that the variations of the frequency of the MR signal, resulting from the movement of the object to be examined, are compensated for.

c) When the phase encoding gradient, i.e. the gradient of the magnetic gradient field active between the RF pulse and the reception of the MR signal, extends in the movement direction of the object to be examined, the phase position of the oscillator signal used for frequency transposition of the MR signal must be varied so as to avoid movement artefacts. Because the variation of the phase position of the MR signal caused by the phase encoding gradient is also dependent on the position of the object to be examined, a change of the position of the object to be examined can be taken into account by variation of the phase position.

An MR device for carrying out the method in accordance with the invention comprises a supporting device for supporting an object to be examined, drive means for displacing the supporting device at a defined speed, a magnet for generating the uniform, steady magnetic field, means for generating RF pulses of predefined frequency, a gradient coil system for generating magnetic gradient fields, p1 means for receiving the MR signals arising in an examination zone, the MR signal being transposed to another frequency range by means of an oscillator signal, means for forming MR images from the frequency-transposed MR signals, a control unit which controls the drive means, the means for generating RF pulses, the gradient coil system and the means for receiving the MR signals so that a plurality of sequences act on the examination zone during the displacement of the supporting device, from one sequence to another a) the frequency of the RF pulses and/or b) the frequency of the oscillator signal and/or c) the phase position of the oscillator signal being adjusted in conformity with the position of the object to be examined relative to the examination zone in such a manner that the part of the object which is imaged in the MR image moves in synchronism with the object.

BRIEF DESCRIPTION OF THE DRAWING

The invention will be described in detail hereinafter with reference to the drawings. Therein.

DETAILED DESCRIPTION OF THE PREFERRED EMBODIMENTS

Figure 1:
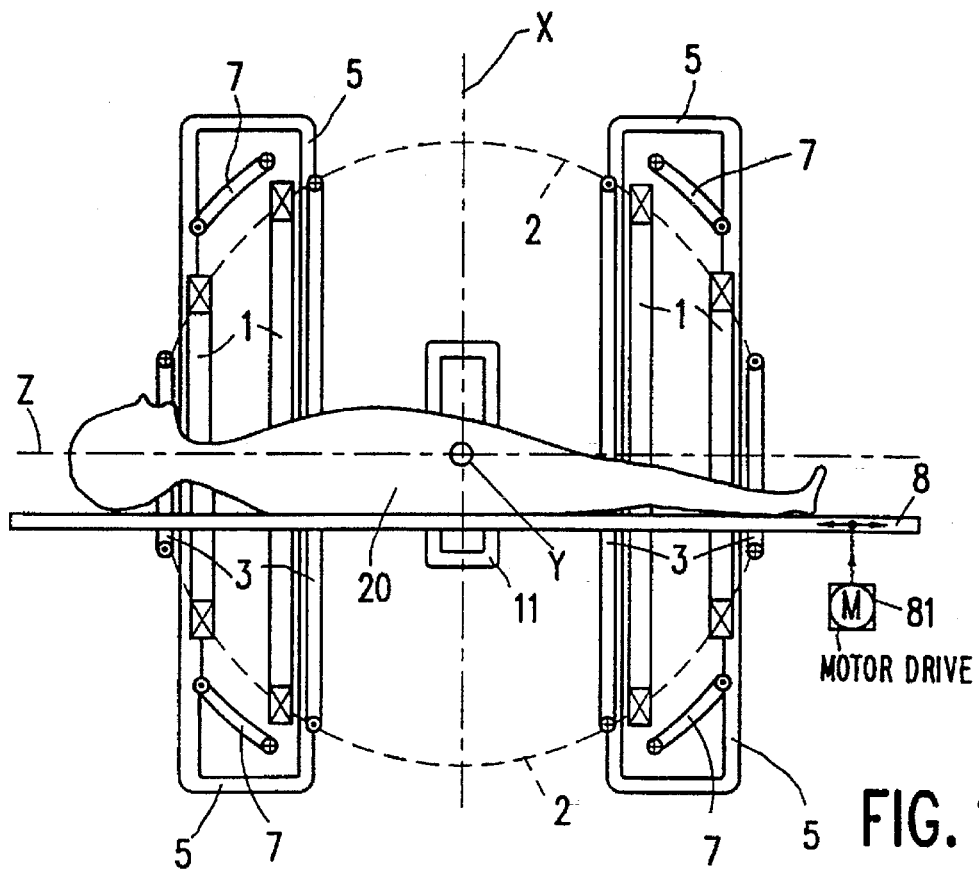
FIG. 1 shows a magnetic resonance tomography apparatus suitable for carrying out the invention.

The magnetic resonance tomography apparatus which is diagrammatically shown in FIG. 1 comprises a system which consists of four coils 1 and which serves to generate a uniform, steady magnetic field whose strength may amount to a fraction of a tesla but also some tesla. This field extends in the z-direction of a cartesian coordinate system (horizontally in FIG. 1). The coils which are concentrically situated with respect to the z-axis may be arranged on the surface 2 of a sphere whose centre forms the so-called isocentre. The patient 20 to be examined is positioned on a table top 8 within said coils. The table top 8 can be displaced in the z-direction, i.e. in the longitudinal direction of the patient, via a motor drive 81.

Four coils 3, preferably arranged on the spherical surface 2, are provided to generate a magnetic field $G_z$ which extends in the z-direction and which linearly varies in this direction. Also provided are four coils 7 which produce a gradient field $G_x$ (i.e. a magnetic field whose strength linearly varies in one direction) which also extends in the z-direction but whose gradient extends in the x-direction. A magnetic gradient field $G_y$ which extends in the z-direction and which has a gradient in the y-direction is generated by four coils 5 which may have the same shape as the coils 7 but which are arranged so as to be offset 90° with respect thereto. Only two of these four coils are shown in FIG. 1.

Because of the three coil systems 3, 5 and 7 for generating the magnetic gradient fields $G_z$, $G_y$ and $G_x$ is symmetrically arranged with respect to the spherical surface 2, the field strength at the centre of the sphere (or the isocentre), at the same time being the origin of said cartesian x-y-z-coordinate system, is determined exclusively by the steady, uniform magnetic field of the coil system 1.

Furthermore, an RF coil 11 is symmetrically arranged relative to the plane z=0 of the coordinate system, which coil is constructed so that it generates an essentially uniform RF magnetic field which extends in the x-direction, i.e. perpendicularly to the direction of the steady, uniform magnetic field. During each RF pulse, the RF coil 11 receives an RF modulated current from an RF generator. Subsequent to a sequence, the RF coil 11. (or a separate RF receiving coil) serves to receive the MR signals produced in the examination zone.

According to the method of the invention, the motor drive 81 displaces the table top 8, and hence the patient 20, relative to the examination zone defined by the coils 1, 3, 5, 7 or the isocentre. During this displacement, taking place at an accurately defined speed (preferably a constant speed), a plurality of sequences successively act on the examination zone.

Figure 2:
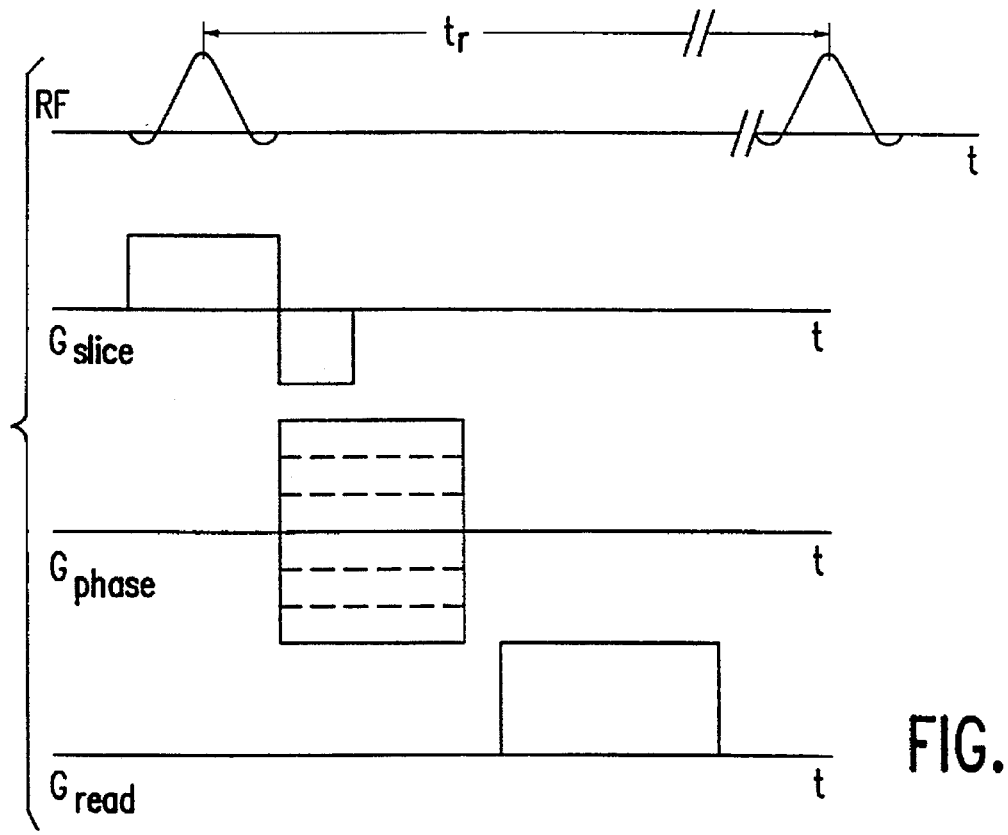
FIG. 2 shows a sequence suitable for the method of the invention.

FIG. 2 shows the position in time of various signals during one of these sequences. The first line shows the position in time of the RF pulse RF, it being assumed for this example that each sequence comprises only one RF pulse. The frequency f of this RF pulse corresponds, generally speaking, to the Larmor frequency at the centre of the sphere 2 (FIG. 1), subject to the relation:

$$f = \gamma B$$

in which f is the frequency of the RF pulse or the Larmor frequency, B is the density of the magnetic induction flux in the uniform, steady magnetic field produced by the coils 1, and γ is the so-called gyromagnetic constant (approximately 42 MHz/T).

During the RF pulse RF, a magnetic gradient field $G_{slice}$ is switched on and off (second line of FIG. 2) so that this RF pulse excites the nuclear magnetization exclusively in a slice extending perpendicularly to the direction of the gradient of $G_{slice}$.

Subsequent to the RF pulse, and before the reading of the MR signal generated thereby, a magnetic gradient field $G_{phase}$ is switched on and off (third line of FIG. 2); the time integral thereof, generally speaking, is varied in equal steps from one sequence to another. Customarily, this gradient is referred to as the phase encoding gradient.

Subsequently, a magnetic gradient field $G_{read}$ is activated. The MR signal arising in the examination zone during this gradient is used for forming an MR image.

The method shown in FIG. 2, in which the gradients $G_{read}$, $G_{phase}$ and $G_{slice}$ extend perpendicularly to one another is known as the 2DF method. However, the invention can also be used for the so-called 3DF method (in which case a second phase encoding gradient is switched; this second phase encoding gradient extends perpendicularly to the first phase encoding gradient and the read gradient $G_{read}$). According to the so-called projection reconstruction method, in which no phase encoding gradient is active and the direction of the read gradient is varied from one sequence to another, the invention can be used only when the slice gradient $G_{slice}$ extends in the direction of movement.

Figure 3:
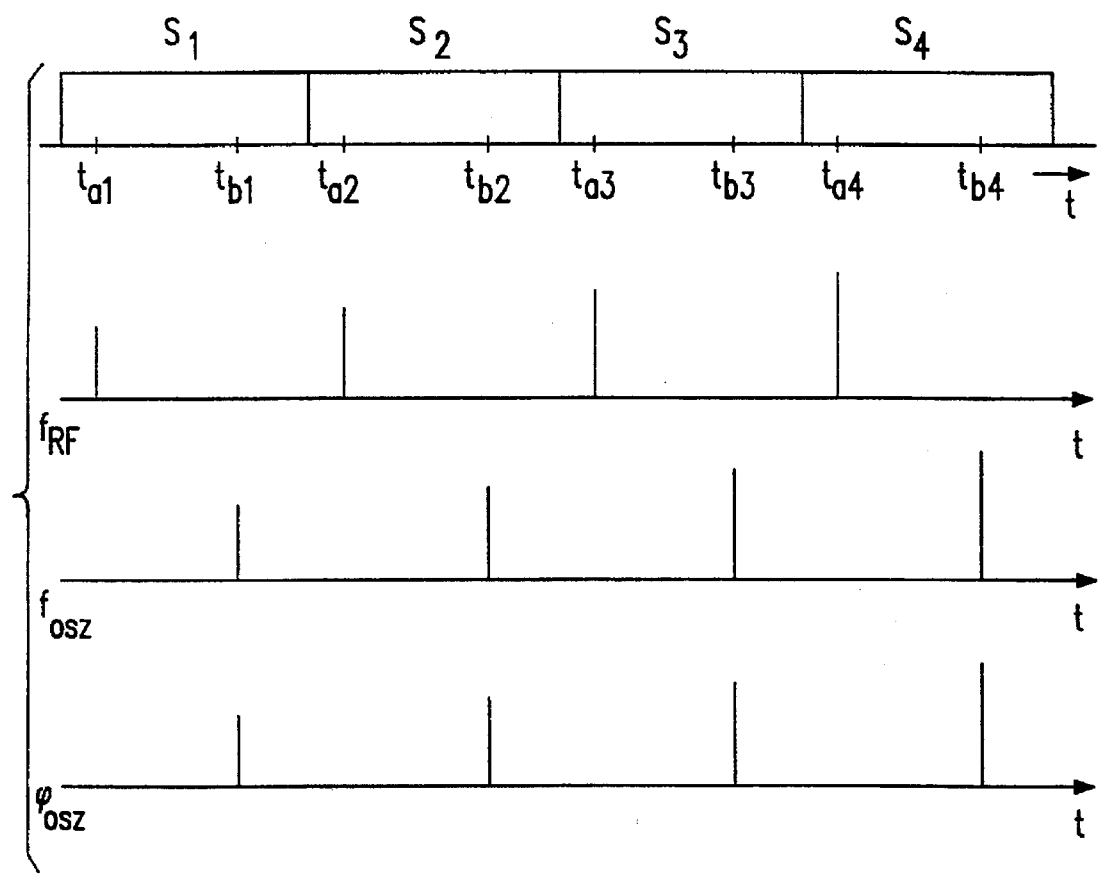
FIG. 3 shows the variation of various parameters during successive sequences.

The sequence is repeated with changed parameters after a repetition time $t_r$. The parameter changes required to ensure that the part of the object which is imaged in the MR image moves in synchronism with the object will be described in detail hereinafter with reference to FIG. 3 which shows the change of these parameters for four successive sequences. The first line of FIG. 3 shows the four sequences $s_1 \ldots s_4$ as successive rectangular blocks, the instants $t_{a1} \ldots t_{a4}$ being the instants within the sequences $s_1 \ldots s_4$ at which the RF pulses RF are generated (see FIG. 2), whereas the references $t_{b1} \ldots t_{b4}$ denote the centres of the intervals during which the read gradient $G_{read}$ is switched on (fourth line of FIG. 2).

The choice of the parameter to be changed from one sequence to another during patient movement is dependent on the position of the slice to be imaged relative to the movement direction. The following possibilities exist:

a) The slice extends perpendicularly to the z-axis, i.e. it is situated in a vertical plane which is perpendicular to the plane of drawing of FIG. 1. In this case the slice selection gradient $G_{slice}$ is identical to $G_z$, or $G_{slice}$ extends in the direction of movement of the patient 20. In the case of the customary 2DF method, this slice extends through the centre of the sphere 2 (FIG. 1) and the frequency of the RF pulses is identical to the Larmor frequency at the centre of the sphere 2. In accordance with the invention, the position of the slice relative to the centre of the sphere should change continuously, because this slice moves in synchronism with the patient. Consequently, the frequency $f_{RF}$ of the RF pulses must be varied from one sequence to another in conformity with the relevant distance between the slice and the isocentre; this is shown in exaggerated form on the second line of FIG. 3. For the frequency variation df between two successive sequences, the following relation holds:

$$df = \gamma \cdot G_{slice} \cdot dz \qquad (1)$$

in which dz represents the displacement of the patient between two successive sequences. When the table top is displaced at a constant speed v, dz is calculated in conformity with:

$$dz = v \cdot t_r \qquad (2)$$

Therein, v is assumed to be positive when the table top moves in the direction in which the magnetic field increases, and negative when it moves in the opposite direction.

b) The read gradient $G_{read}$ extends in the z-direction, i.e. a slice is excited which extends parallel to the z-axis (a horizontal or a vertical slice). In order to recognize the effect of the movement of the patient in the direction of the read gradient, the acquisition of two MR signals by two sequences which exceed one another at a distance in time $t_r$ will be observed; it is assumed that a spin packet is present at the location $z_1$ for the first sequence. The frequency difference $f_1$ between this spin packet and a spin packet at the centre of the sphere is given by:

$$f_1 = \gamma \cdot G_{read} \cdot z_1 \qquad (3)$$

For the same spin packet, for the second sequence where it is situated at the location $z_1 + dz$, it holds for the frequency difference $f_2$ with respect to the centre of the sphere that $$f_2 = \gamma \cdot G_{read}(z_1 + dz) \qquad (4)$$

Thus, whereas a spin packet in a resting patient always precesses at the same frequency, in the case of a displacement the precessional frequency changes from one sequence to another in conformity with the equation $$df = f_2 - f_1 = \gamma \cdot G_{read} \cdot dz \qquad (5)$$

The movement artefacts induced by the displacement of the patient can thus be avoided when the oscillator frequency $f_{osz}$, whereby the MR signal is transposed to a lower frequency band in the receiver, is changed to the same extent as the precessional frequency. Between two successive sequences, therefore, the oscillator frequency $f_{osz}$ must be changed by df in conformity with the equation (5). This is shown for four successive sequences on the third line of FIG. 3, it being assumed that the movement takes place in the direction in which the magnetic field strength increases during reading.

c) Finally, the phase encoding gradient $G_{phase}$ may extend in the movement direction (i.e. in the z-direction) when a horizontal or vertical slice of the patient which extends parallel to the z-axis is examined. The phase-encoding gradient influences the phase of the signal component of the MR signal, caused by a spin packet, in dependence on the distance between this spin packet and the centre of the sphere. In order to enable the image field to move again in synchronism with the patient, in this case the phase $\phi_{osz}$ of the oscillator signal whereby the MR signal is transposed to a lower frequency range in the receiver is varied from one sequence to another in conformity with the displacement of the table top. This is based on the consideration that the displacement of the patient causes a change of the phase position for a given spin packet in the patient as a function of the location in a way other than it would in a resting patient. This can be compensated in that the MR signal is mixed with a correspondingly phase-shifted signal. For the phase variation for two successive sequences it then holds that $$d\phi = 2\pi \cdot v \cdot t_r / F_{ov} \qquad (6)$$

Therein, $F_{ov}$ is the magnitude of the imaging area in the movement direction. Equation (6) shows that the phase of the oscillator signal with which the MR signal is mixed in the receiver must be varied by a constant amount from one sequence to another as is indicated on the fourth line of FIG. 3.

d) In the most common case, where the image to be reconstructed extends obliquely (at an angle other than 90°) with respect to the movement direction, the steps shown in FIG. 3 must be simultaneously taken (variation of $f_{RF}$, $f_{osz}$ and $\phi_{osz}$ from one sequence to another in conformity with the relevant position of the object to be examined).

Figure 4:
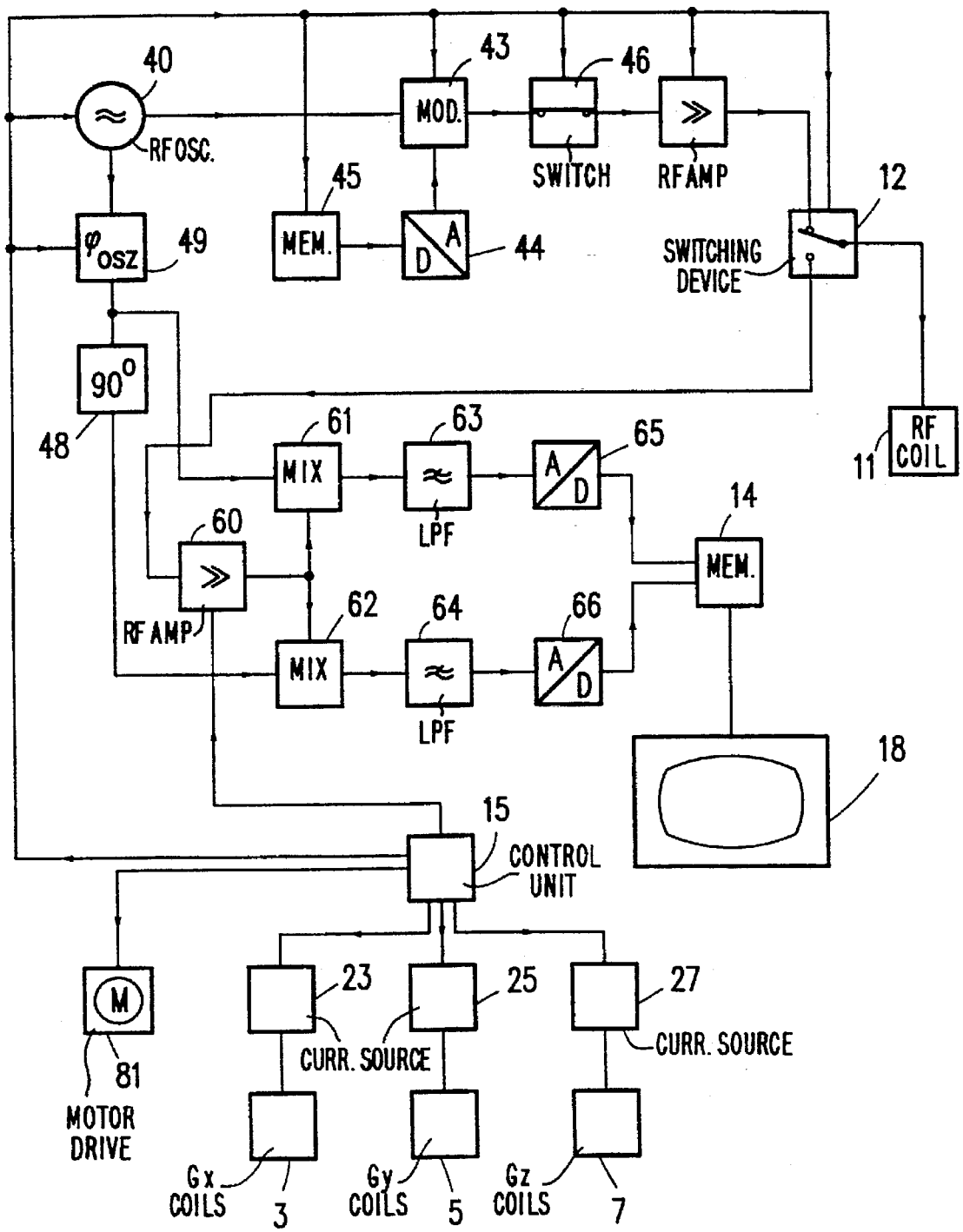
FIG. 4 shows a simplified block diagram of a magnetic resonance tomography apparatus.

FIG. 4 shows the block diagram of a magnetic resonance tomography apparatus which is suitable for carrying out the method of the invention. An RF oscillator 40 whose frequency can be digitally controlled by a control unit 15 supplies oscillations of a frequency which corresponds to the Larmor frequency of the nuclei to be excited. The output of the oscillator 40 is connected to an input of a modulator 43. The modulator receives a modulation signal from a digital-to-analog converter 44 whose input is connected to a digital memory 45. The memory 45 stores a number of envelope signals, each as a sequence of digital data words, one of which is read for each sequence. The modulator 43 processes the input signals applied thereto so that a carrier oscillation modulated with the envelope signal appears on its output. The output signal of the mixing stage is applied, via a switch 46 which is controlled by the control device 15 to an RF power amplifier 47 whose output is connected to a switching device 12 which can also be controlled by the control unit 15. The RF coil 11 is connected to the switching device. During the generating of the RF pulses, the switch 46 is closed and the switching device 12 is in the position shown in the drawing.

The switching device is in the opposite position when the read gradient $G_{read}$ is switched on and off. The RF coil 11 then receives the MR signal occurring in the examination zone during this period. This MR signal is applied to an RF amplifier 60 which comprises a switching input which is controlled by the control device 15 and via which it can be blocked so that the gain is substantially zero. The output of the amplifier is connected to the first inputs of two multiplying mixing stages 61 and 62, each of which produces an output signal which corresponds to the product of its input signals. The second input of the mixing stage 61 is connected to the output of a phase shifter 49 which shifts the phase of the oscillator signal supplied by the oscillator 40 by an amount which can be adjusted by the control device 15. The second input of the mixing stage 62 is connected to the output of a 90° phase shifter 48 whose input is connected to the output of the phase shifter 49. Consequently, in the mixing stages 61 and 62 the MR signal is mixed with two 90° phase-shifted oscillations of oscillator frequency $f_{osz}$.

The output signals of the mixing stages 61 and 62 are applied, via low-pass filters 63 and 64 which suppress the frequency supplied by the oscillator 40 as well as all higher frequencies and which transmit low-frequency components, to a respective analog-to-digital converter 65, 66. These converters convert the analog signals detected by the circuit 61 . . . 64, forming a quadrature demodulator, into digital data words. The analog-to-digital converters 65 and 66 and the memory 14 receive their clock pulses from a clock pulse generator 16 which is controlled by the control unit 15 so that the signals supplied by the RF coil 11 and transposed to the low-frequency range can be converted into a series of digital data words only during a time interval which is defined by the activation of the read gradient $G_{read}$. An image processing unit 14 reconstructs the nuclear magnetization distribution in the examination zone from the data words of a plurality of MR signals and displays this distribution on a monitor 18. Moreover, the control unit 15 also controls the motor 81 for the table top movement, for example a step motor, so that the position of the table top 8 is accurately defined at all times. Moreover, for the gradient coils 3, 5 and 7 (FIG. 1) there are provided controllable current sources 23, 25 and 27 which supply currents whose variation in time can be controlled by the control unit 15.

For the customary execution of the 2DF method on the basis of the sequence of FIG. 2, the oscillator frequency $f_{osz}$ always has the same value for generating the RF pulses, which value corresponds to the Larmor frequency at the centre of the sphere 2. The oscillator frequency does not change either upon reception of the MR signals. The only parameter which is varied from one sequence to another is the phase encoding gradient.

In accordance with the invention, further parameters are changed:

a) When MR images of a slice extending perpendicularly to the movement direction are to be formed during the introduction of the patient, the frequency $f_{RF}$ of the RF pulses must be varied from one sequence to another (second line of FIG. 3). The control unit 15 must then control the oscillator 40 so that it supplies oscillations of a corresponding frequency. Upon reception of the MR signals generated by the RF pulses during the individual sequences, however, the oscillator frequency may not change, i.e. it must correspond to the Larmor frequency of the centre of the sphere 2 (FIG. 1) in which no magnetic gradient fields are present.

b) When the read gradient $G_{read}$ extends in the movement direction, the frequency of the RF pulse $f_{RF}$ remains the same in all sequences; it corresponds to the Larmor frequency at the centre of the sphere. However, the frequency $f_{osz}$ with which the MR signals are mixed in the mixing stages 61 and 62 must be changed from one sequence to another. The oscillator 40 must then be continuously switched to and fro by the control unit 15 between a constant frequency upon transmission and a frequency which is changed from one sequence to another upon reception of the MR signal.

c) When the phase encoding gradient extends in the movement direction, the oscillator frequency remains the same for all sequences during generating of the RF pulses as well as upon reception of the MR signals. However, the phase shift is changed from one sequence to another, in conformity with the last line of FIG. 3, by the phase shifter 49 which is controlled by the unit 15.

The device shown in FIG. 4 processes the MR signals in analog form as far as the output of the quadrature demodulator 61 . . . 64. However, the invention can also be used when the processing of the MR signals is highly digital. The same applies also to the generating of the RF signal.

It has also been assumed that for the transmission of the RF pulses and the reception of the MR signals generated thereby the same RF coil is used. The invention, however, can also be used when a separate RF coil is used for receiving the MR signals. This coil can be moved together with the patient or be mounted so as to be stationary. In this case it is advisable to use a coil array composed of a plurality of subcoils.

We claim:

1. An MR imaging method comprising moving an object to be examined at a defined speed relative to an examination zone, acting on the examination zone with a plurality of sequences in the presence of a steady, uniform magnetic field, each of said sequences comprising at least one RF pulse, receiving MR signals arising in the examination zone, transposing said received MR signals in frequency by multiplication by an oscillator signal, forming an MR image from the frequency transposed signals, and adjusting from one sequence to another, one or more of the frequency of the RF pulse, the frequency of the oscillator signal and, the phase position of the oscillator signal in conformity with the position of the object to be examined relative to the examination zone in such a manner that a part of the object being imaged in each sequence moves relative to the examination zone in synchronism with the object.

2. An MR apparatus having an examination zone, said apparatus comprising:

a supporting device for supporting an object to be examined in a manner that at least a portion of the object is within the examination zone, drive means for displacing the supporting device at a defined speed thereby moving the object relative to the examination zone, a magnet for generating a uniform, steady magnetic field in the examination zone, means for generating RF pulses of predefined frequency acting on the examination zone, a gradient coil system for generating magnetic gradient fields superimposed on the uniform, steady magnetic field in the examination zone, means for receiving MR signals arising in the examination zone, and for transposing the received MR signals in frequency by multiplication by an oscillator signal, to form frequency-transposed MR signals, means for forming MR images from the frequency-transposed MR signals, and a control unit which controls the drive means, the means for generating RF pulses, the gradient coil system and the means for receiving and transposing the MR signals so that a plurality of sequences comprising at least one RF pulse and magnetic gradient fields act on the examination zone during the displacement of the supporting device from one sequence to another, wherein one or more of the frequency of the RF pulse, the frequency of the oscillator signal, and the phase position of the oscillator signal are adjusted in conformity with the position of the object to be examined relative to the examination zone in such a manner that a part of the object which being imaged in each sequence moves relative to the examination zone in synchronism with the object.

* * * * *